US006900675B2

(12) United States Patent
Briones (10) Patent No.: US 6,900,675 B2
(45) Date of Patent: May 31, 2005

(54) ALL DIGITAL PLL TRIMMING CIRCUIT

(75) Inventor: Luis J. Briones, Chandler, AZ (US)

(73) Assignee: Standard Microsystems Corporation, Hauppauge, NY (US)

( * ) Notice: Subject to any disclaimer, the term of this patent is extended or adjusted under 35 U.S.C. 154(b) by 0 days.

(21) Appl. No.: 10/653,614

(22) Filed: Sep. 2, 2003

(65) Prior Publication Data

US 2005/0046452 A1 Mar. 3, 2005

(51) Int. Cl.$^7$ ................................................ H03L 7/06

(52) U.S. Cl. ........................................ 327/147; 331/17

(58) Field of Search ................................ 327/147, 156, 327/160, 162; 331/17, 1 A, 25, 36 R, 117 R, 177 R, 177 V (56) References Cited

U.S. PATENT DOCUMENTS

| | | | |
|---|---|---|---|
| 4,829,258 A | 5/1989 | Volk et al. ................... | 327/156 |
| 4,987,387 A | 1/1991 | Kennedy et al. ............ | 331/1 A |
| 5,382,922 A | 1/1995 | Gersbach et al. ........... | 331/1 A |
| 5,619,170 A | 4/1997 | Nakamura ................... | 331/1 A |
| 5,668,503 A | 9/1997 | Gersbach et al. ........... | 331/1 A |
| 5,736,904 A | 4/1998 | Humphreys et al. ......... | 331/10 |
| 5,877,657 A | 3/1999 | Yoshinaka ................... | 331/16 |
| 6,150,891 A | 11/2000 | Welland et al. .............. | 331/25 |
| 6,167,245 A | 12/2000 | Welland et al. .............. | 455/260 |
| 6,175,282 B1 | 1/2001 | Yasuda ........................ | 331/44 |
| 6,308,055 B1 | 10/2001 | Welland et al. .............. | 455/260 |
| 6,317,004 B1 | 11/2001 | Akagi et al. ................. | 331/17 |
| 6,445,257 B1 * | 9/2002 | Cox et al. ................ | 331/117 R |
| 6,664,827 B2 | 12/2003 | O'Leary et al. ............ | 327/156 |
| 2002/0033739 A1 * | 3/2002 | Bisanti et al. ............ | 331/36 R |

OTHER PUBLICATIONS

Fahim, A.M.; Elmasry, M.I.; "A Fast Lock Digital Phase–Locked–Loop Architecture for Wireless Applications," IEEE Transactions on Circuits and Systems—II: Analog and Digital Signal Processing, [see also IEEE Transactions on Circuits and Systems II: Express Briefs], vol. 50, No. 2, Feb. 2003, pp. 63–72.

Sato, F.; Saba, T.; Park, D.–K.; Mori, S.; "Digital Phase–Locked Loop With Wide Lock–In Range Using Fractional Divider," IEEE Pacific Rim Conference on Communications, Computers and Signal Processing 1993, vol. 2, May 1993, pp. 431–434.

Efendovich, A.; Afek, Y.; Sella, C.; Bikowsky, Z.; "High Resolution Multi–Frequency Digital Phase Locked Loop," IEEE International Symposium on Circuits and Systems 1993, vol. 2, May 3–6, 1993, pp. 1128–1131.

* cited by examiner

*Primary Examiner*—Linh My Nguyen
(74) *Attorney, Agent, or Firm*—Meyertons Hood Kivlin Kowert & Goetzel, P.C.; Jeffrey C. Hood (57) ABSTRACT

In one set of embodiments, the invention comprises a system and method for automatically trimming the center frequency of a VCO in a PLL. The trimming may be performed by a digitally controlled trimming circuit, which may be operated to modify a gain of the VCO and may be used as part of a clock recovery architecture or as part of a high-end PLL. It may also be used by itself in low-end PLLs. In one embodiment, a second loop based solely on the frequency difference between a reference frequency and a divided output frequency of the VCO is introduced into the PLL loop. This frequency loop may be optimized by the inclusion of a gain control stage, which may lower the locking time. A control module may also be introduced to delay the deployment of the phase detector until the frequency loop has fully converged, that is until trimming has been completed, thus preventing the two loops from interfering with each other and compromising each other's performance.

33 Claims, 6 Drawing Sheets

ALL DIGITAL PLL TRIMMING CIRCUIT

BACKGROUND OF THE INVENTION

1. Field of the Invention

This invention relates generally to the field of analog and/or digital circuit design and, more particularly, to phase-locked loop (PLL) design.

2. Description of the Related Art

A phase-locked loop (PLL) is an electronic circuit, in which a voltage- or current-driven oscillator is constantly being adjusted to lock on (or match in phase) the frequency of an input signal. Therefore, PLLs are useful for providing stability for communications channels by keeping them set to specific respective frequencies. In addition, PLLs are also used for generating signals, modulating or demodulating signals, reconstituting a particular signal with less noise, or multiplying/dividing a frequency. In general, PLLs are widely used in applications requiring a high degree of noise immunity and narrow bandwidth, for example wireless communications that employ signal-carrying methods of phase modulation (PM), frequency modulation (FM), or amplitude modulation (AM). Because of the high frequencies usually present in microwave applications, most all components of PLL systems used therein are typically constructed of discrete circuits. For many of the communication system applications where frequencies are usually in the 100 MHz range, phase-locked loop devices are typically manufactured as integrated circuits (ICs) due to their low cost versus high performance. PLLs are also commonly used for digital data transmission and in applications that process analog information.

Typically a PLL consists of a voltage-controlled oscillator (VCO) tuned using a special semiconductor diode called a varactor. When part of a VCO, a varactor is typically used as a variable capacitance in an LC oscillator configuration, where the junction capacitance of the varactor's PN junction can be varied by changing the reverse voltage across the PN junction. The VCO is initially tuned to a frequency, typically called the center frequency, close to the desired receiving or transmitting frequency. Typically this means that the VCO seeks and locks onto a desired frequency determined by the output of a crystal-controlled reference oscillator through a circuit called a phase detector. This is accomplished through the design of a feedback loop. If the VCO frequency departs from the selected frequency determined by the crystal reference, the phase detector produces control voltage that is applied to the varactor, thus bringing the VCO back to the reference frequency. The frequency of the VCO when no control voltage is applied to the inputs of the VCO is the center frequency. In general, the PLL, VCO, reference oscillator, and phase comparator together comprise a frequency synthesizer. Typically, wireless equipment that utilizes the type of frequency control described above is said to be frequency-synthesized.

Figure 1:
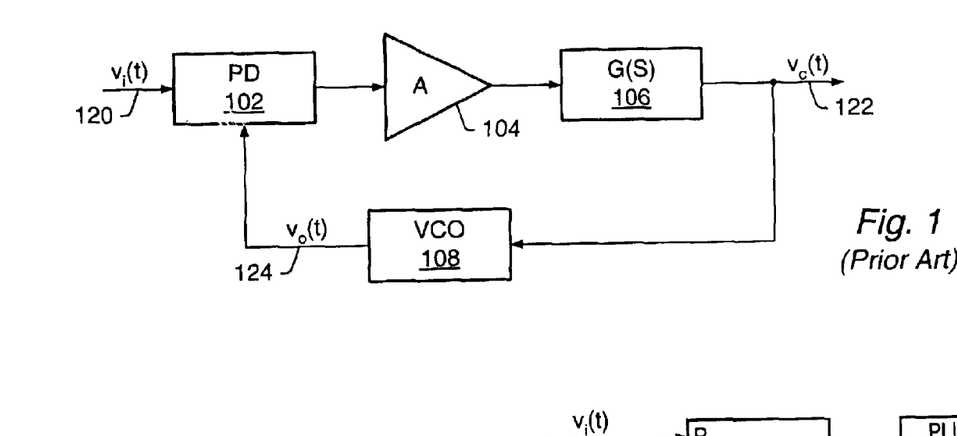
FIG. 1 illustrates one embodiment of a PLL in accordance with prior art.

FIG. 1 illustrates the block diagram of a typical PLL. The PLL configuration shown includes a phase detector (PD) 102 coupled to a loop filter 106 through an amplifier 104, with the output of loop filter 106 coupled to a VCO 108. The output of VCO 108 is fed back to PD 102 completing the loop. A reference input signal $v_i(t)$ 120 is provided to PD 102. The output $v_c(t)$ 122 of loop filter 106 provides the control voltage input for VCO 108, generating the PLL output signal $v_o(t)$ 124. As previously stated, by providing $v_c(t)$ 122 to VCO 108, the frequency of $v_o(t)$ 124 is brought back to the selected frequency determined by reference input $v_i(t)$ 120. For further flexibility, many PLLs also include a loop frequency divider (not shown) coupled to the output of VCO 108, with the output of the loop frequency divider feeding into PD 102.

One problem associated with PLLs and PLL design is the introduction of PLL phase noise due to the VCO. For IC PLLs, process variation, temperature, and biasing typically lead to a need for PLL loop component tolerance compensation. Consequently, improvements sought in PLL design have included PLL compensation loop filter size reduction (smaller component values), improved lock time, and virtual elimination of non-linear locking behavior of the PLL. These issues have been addressed in a variety of ways when designing IC PLLs. In some PLLs, compensation has been implemented based on monitoring the control voltage. If the control voltage reaches some upper or lower limit, a new set of varactors is switched in or out of the VCO in order to bring the control voltage level down or up, respectively. Generally, the non linear nature of the phase frequency detector in the PLL and the limited bandwidth of the PLL itself may result in unwanted side effects when utilizing control voltage based solutions. For example, the speed at which the control voltage rises is proportional to the PLL bandwidth. Thus, while opening the loop bandwidth may present a solution, the reference frequency filtration will suffer. At the same time, the presence of phase slips in the lock acquisition phase can further slow down the decision point.

Another approach involved in PLL compensation is based on monitoring the phase slips that occur when a phase detector goes beyond its linear range. Typically, phase detectors have a limited frequency range difference within which they can allow the PLL to lock on to the desired frequency. If there is an excessive difference between the two input terminals of the phase detector, a phase slip may occur in which the detector generally pumps in the wrong direction. By monitoring the occurrence of these phase slip events, a trimming strategy can typically be devised. However, by definition, the reference and feedback inputs of the phase detector must accumulate enough phase error to trigger this event. Therefore, as the frequency error between the two input terminals is reduced, the rate of the phase slips is reduced as well, thus providing an inconsistent locking time. For example, if the upper limits of the VCO differ from the lock frequency by 1 Hz, then it will take one second for a $2\pi$ phase slip to occur before a new VCO range can be switched in.

Many other problems and disadvantages of the prior art will become apparent to one skilled in the art after comparing such prior art with the present invention as described herein.

SUMMARY OF THE INVENTION

In one set of embodiments the invention comprises a system and method for automatically trimming the center frequency of a VCO in a PLL. The trimming may be performed by a digitally controlled trimming circuit (DCTC), which may be used as part of a clock recovery architecture or as part of a high-end PLL. It may also be used by itself in low-end PLLs, and may be operated to change the gain of the VCO. In one embodiment, a second loop based solely on the frequency difference between a reference frequency and a divided output frequency of the VCO is introduced into the main PLL loop. This frequency loop, also referred to as a trimming loop, may be optimized by the inclusion of a gain control stage, which may lower the locking time. A control module may be introduced to delay the deployment of the phase detector until the frequency loop has fully converged, that is until trimming has been completed, thus preventing the two loops from interfering with each other.

In one embodiment, the VCO in the PLL is implemented with an external user specified coil coupled to a tuning varactor to form an LC tuning element. A low VCO gain in this configuration may be achieved by introducing a varactor bank, which may be used together with the LC tuning element to vary the output frequency of the VCO. The varactor bank may be controlled by the DCTC for varying the fixed capacitance ratio to the capacitance of the tuning varactor. Capacitance of the tuning varactor, which is controlled by the main (analog) PLL loop, may be substantially lower than a bulk capacitance of the varactor bank, leading to a reduced VCO gain during locked operation. As previously mentioned, the DCTC may also be operated to suspend operation of the main analog loop until all trim bits of the DCTC have been set, and enable the main analog loop to resume normal operation thereafter. In other words, while the trimming loop is operating, the main analog loop may be disabled by the DCTC until the current frequency reaches a level that is within a certain percentage of the desired frequency, at which point the DCTC may operate to enable the main analog loop and disable the trimming loop.

In one set of embodiments the DCTC includes a reference divider, a frequency detector, a gain and a gain controller, an integrator, and a capacitance trim control circuit. The reference divider (divide value of M) may be used for generating a clock signal that is provided to a counter (with a range of −M to M), which may be part of the frequency detector, for a frequency locking rate that is M times higher than the output of the divided (by N) VCO output. At the end of every N counter cycles, the output of the counter may be transferred to and latched by a differentiator block, which may also be part of the frequency detector, and the internal value of the counter may be reset for the next count cycle. Thus, a number of M counts may be present at the output of the counter for every N cycles of the counter, when the frequency loop is fully settled. The difference appearing at the output of the differentiator block may then be passed to a multiplier implementing the gain, which may be equivalent to an operation of $2^n$. The exponential portion (n) of the gain may be controlled by the gain controller. Actual resolution achieved by the gain controller through the multiplier may depend on the number of trim control lines used by the capacitance trim control circuit to control the corresponding number of varactors in the varactor bank. In one embodiment, the output of the multiplier is provided to the integrator, and the output of the integrator is used by the capacitance trim control circuit to control the overall capacitance represented by the varactor bank.

In one set of embodiments the VCO in the PLL is implemented using a ring oscillator, in which case the DCTC may operate to control current provided to individual components, which may be operational transconductance amplifiers, of the ring oscillator through a programmable current source. The number of trim control lines may determine the smallest current value by which the DCTC may increase or decrease the current provided by the programmable current source. The output frequency of the VCO will be proportional to the current provided to the ring oscillator comprised in the VCO.

The frequency difference between the trimming loop and the main PLL loop may be made very small. This may help eliminate the phase slips, and thus many non-linear acquisition characteristics typically present in traditional PLLs. Embodiments of the present invention may also provide increased locking speed when contrasted with a typical PLL. In one embodiment, the trimming loop may be optimized to have a locking time spanning less than eight cycles, over a very wide gain change. Also, the counter cycle may be made faster than the reference frequency at the phase detector. Due to the small change in frequency between the loop frequency at the time of release of the trimming loop and the final PLL frequency, the overall lock time may be substantially reduced. (The loop settling time for a given phase margin may be given as a function of the frequency step). This may prove useful in clock recovery loops where filtration of the reference frequency may require small bandwidth loops at the expense of locking time.

Thus, various embodiments of the invention may provide a means for automatically trimming the center frequency of a VCO in a PLL using a digitally controlled trimming circuit configured in a second loop based solely on the frequency difference between a reference frequency and a divided output frequency of the VCO, thus reducing phase noise and increasing the range of the main PLL loop, while also providing a faster locking time.

BRIEF DESCRIPTION OF THE DRAWINGS

The foregoing, as well as other objects, features, and advantages of this invention may be more completely understood by reference to the following detailed description when read together with the accompanying drawings in which.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents, and alternatives falling within the spirit and scope of the present invention as defined by the appended claims. Note, the headings are for organizational purposes only and are not meant to be used to limit or interpret the description or claims. Furthermore, note that the word "may" is used throughout this application in a permissive sense (i.e., having the potential to, being able to), not a mandatory sense (i.e., must)." The term "include", and derivations thereof, mean "including, but not limited to". The term "connected" means "directly or indirectly connected", and the term "coupled" means "directly or indirectly connected".

DETAILED DESCRIPTION OF THE PREFERRED EMBODIMENTS

As used herein, a "trigger" signal is defined as a signal that is used to initiate, or "trigger", an event or a sequence of events in a digital system. A trigger signal is said to be in a "triggering state" at a time when it initiates a desired event, or sequence of events. A periodic trigger signal may commonly be referred to as a "clock". In a "synchronous" digital system, generally a clock, commonly referred to as a "system clock", may be used for initiating most events, or sequences of events. An example of a triggering state may be, but is not limited to, a rising edge of a pulse of a clock in a synchronous digital system.

When an event, or a sequence of events, is said to be initiated "in response to" receiving a stimulus signal, it may be implied that the event, or the sequence of events, is initiated as a result of a combination of a trigger signal, used in triggering the event or sequence of events, being in a triggering state at a time when the stimulus signal is asserted. In one set of embodiments, the sending of a pulse through an output port may indicate a point in time at which a leading edge of the pulse occurs at the output port, and the receiving of a pulse through an input port may indicate a point in time at which a leading edge of the pulse occurs at the input port. The term "latency" is defined as a period of time of finite length. A signal is said to be delayed "by a latency" when a time period normally required for the signal to travel from a source point to a destination point is increased by a time period equivalent to the latency, where the signal is being delayed between the source point and the destination point.

Figure 2:
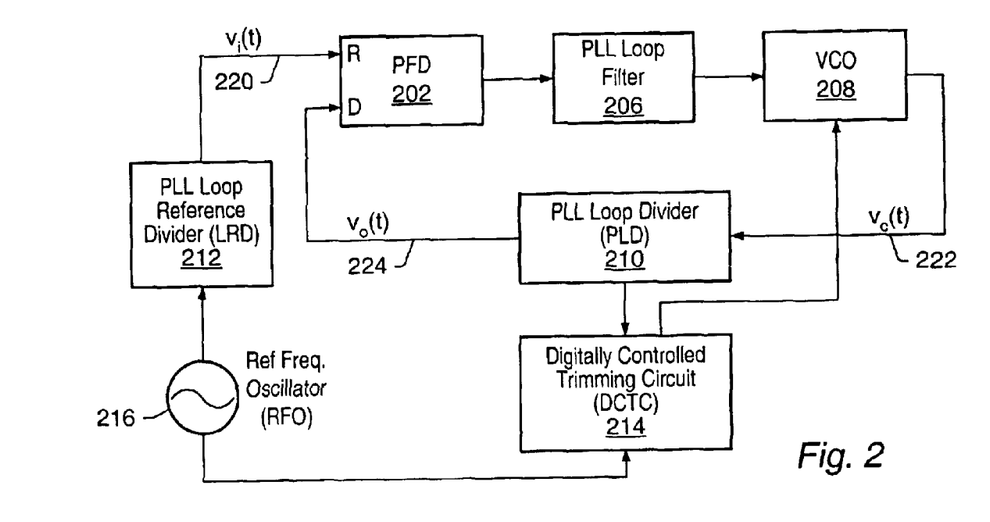
FIG. 2 illustrates the block diagram of a PLL implemented in accordance with one set of embodiments of the present invention.

FIG. 2 illustrates the block diagram of a PLL implemented in accordance with one set of embodiments of the present invention. The PLL configuration shown may include a PLL phase detector (PFD) 202 coupled to a PLL loop filter 206 with the output of PLL loop filter 206 coupled to a VCO 208. In one embodiment, VCO 208 is controlled by a digitally controlled trimming circuit (DCTC) 214. Output $v_c(t)$ 222 of VCO 208 may be coupled to a PLL loop divider (PLD) 210, which may provide feedback to PFD 202 and DCTC 214. A reference frequency oscillator (RFO) 216 may be used to provide a reference frequency into a PLL loop reference frequency divider (LRD) 212 used to generate a reference input signal $v_r(t)$ 220. $v_r(t)$ 220 may be used as the reference input to PFD 202. In one embodiment, RFO 216 also provides a reference frequency input to DCTC 214. In other embodiments, $v_r(t)$ 220 may be provided as the reference frequency input to DCTC 214 instead of a direct output of RFO 216. PLD 210 may provide the PLL output signal $v_o(t)$ 224. PLD 210, DCTC 214, and VCO 208 comprise a trimming loop, which may be operated to control the gain of VCO 208, thus reducing a required gain in the main port of the PLL and consequently reducing phase noise. In other words, by reducing the gain of VCO 208, a greater range for the main PLL loop may be achieved. As used herein, "trimming" and "trimming process" refer to operating the trimming loop, and is said to be occurring while the trimming loop is enabled and the main PLL loop is disabled.

In one set of embodiments, frequency tuning may be employed for achieving fast acquisition in narrow loop bandwidth PLLs, since acquisition time increases proportionally to the initial frequency difference and inversely proportionally to the loop bandwidth. One reason for the requirement of a narrow loop might be a need to attenuate the reference spur. For low jitter applications an overdamping loop with low gain may also be a requirement. Considering a change in the output frequency of VCO 208:

$$\Delta f = \frac{1}{2\pi\sqrt{L(C_{min} + \Delta C)}}; \qquad (1)$$

a low VCO gain may be obtained when ΔC in equation (1) is of low sensitivity, yielding a low tuning range.

Figure 3:
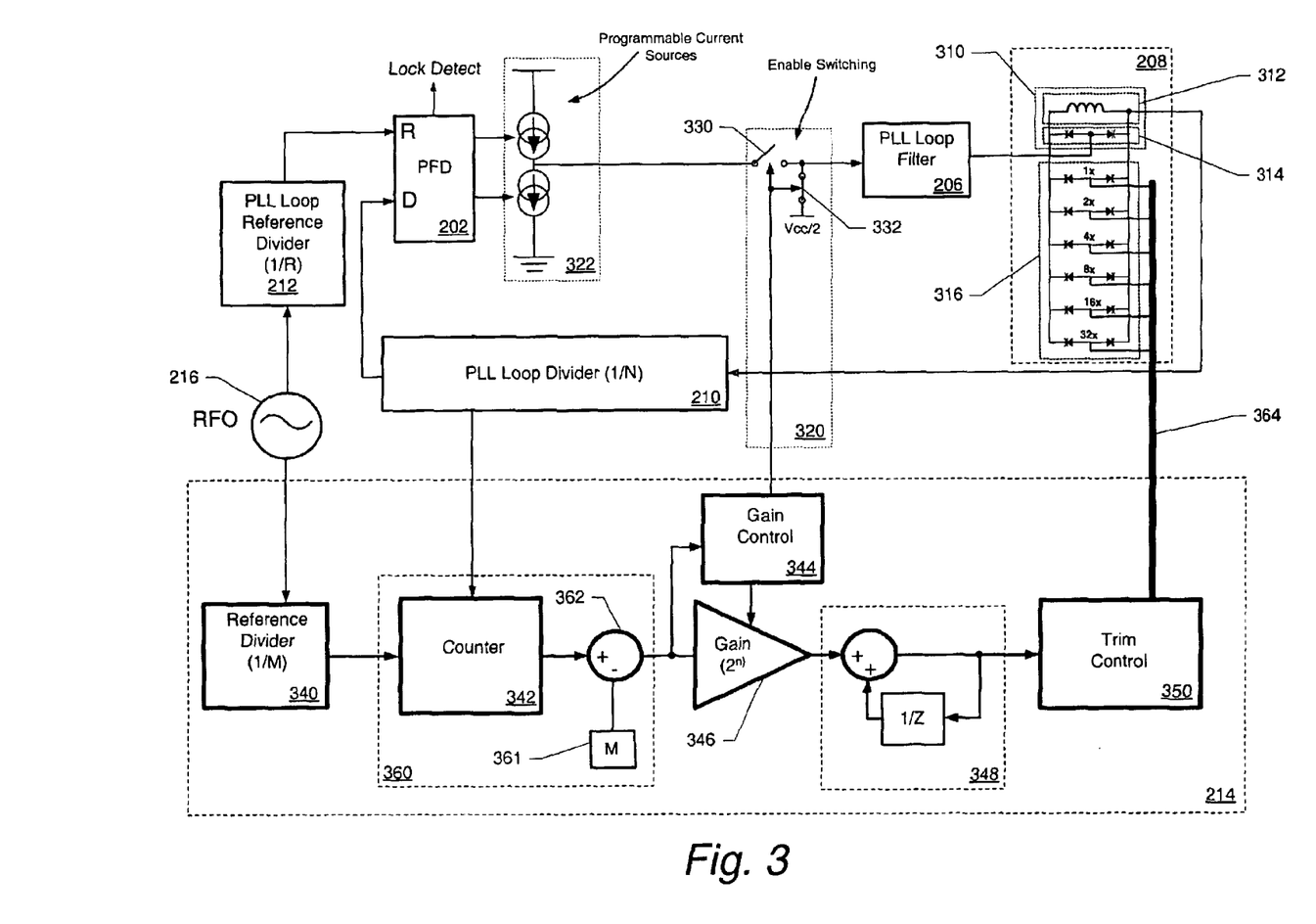
FIG. 3 illustrates one embodiment of the PLL shown in FIG. 2, using varactors.

FIG. 3 illustrates one embodiment of the system shown in FIG. 2, with main PLL loop components PFD 202, PLL loop filter 206, VCO 208, PLD 210, and LRD 212. In this embodiment, VCO 208 is implemented with an external user specified coil 312 coupled to a tuning varactor 314 to form an LC tuning element 310. A low VCO 208 gain in this configuration may be achieved by introducing a varactor bank 316, which together with LC tuning element 310 may represent term '$L(C_{min}+\Delta C)$' in equation (1). Varactor bank 316 may be controlled by DCTC 214 for varying the fixed capacitance ratio to the capacitance of tuning varactor 314. Capacitance of varactor 314, which is controlled by the main (analog) PLL loop, may be substantially lower than a bulk capacitance of varactor bank 316, which is controlled by DCTC 214, leading to a reduced VCO 208 gain during locked operation. In addition to providing a lower VCO 208 gain, DCTC 214 may also be operated to suspend operation of the main analog loop until all trim bits of 214 DCTC have been set, and enable the main analog loop to resume normal operation thereafter. In other words, while the trimming loop is operating, the main analog loop may be disabled by DCTC 214 until the current frequency reaches a level that is within a certain percentage of the desired frequency, at which point DCTC 214 may operate to enable the main analog loop and disable the trimming loop. This may insure that operation of the main analog loop does not interfere with operation of the trimming loop, and vice versa. The number of trim control lines 364 (one respective line going to each respective varactor in varactor bank 316) may determine how close the current frequency may be to the desired frequency when control is returned from the trimming loop to the main analog loop. In the embodiment of FIG. 3 a resolution of six bits is illustrated, represented by six varactors and six trim control lines 364 as shown inside varactor bank 316. In other embodiments the number of varactors in varactor bank 316 and the number of trim control lines may be different for a greater or lesser resolution achieved by the trimming loop.

Referring again to FIG. 3, DCTC 214 may include a reference divider (RD) 340, a frequency detector (FD) 360, a Gain 346 and a gain controller (GC) 344, an integrator (IN) 348, and a capacitance trim control circuit (TC) 350. Considering the reference frequency generated by RFO 216 and the desired frequency of VCO 208 corresponding to the final main PLL loop frequency, the range, or accuracy, for the trimming process may be determined by selecting a number of trimming pulses or steps—corresponding to the desired accuracy—that may be counted, representing a duration for which trimming may occur. Thus, in one embodiment, FD 360 comprises a counter 342 and a differentiator block 362. Counter 342 may be used to count the number of trimming pulses. The output of counter 342 may be transferred to differentiator block 362 which may subtract from it a number representing the number of trimming pulses (show as subtraction element 361). Thus, in one embodiment, when the output of counter 342 represents the number of trimming pulses, the output of differentiator block will be zero and trimming will be complete. In one embodiment, RD 340 (divide value M) is used for generating a reset signal to counter 342, which has a counting range of −M to M, or 2*M. In this embodiment, the signal provided by the output of PLD 210 may be considered a clock signal for counter 342, where at the end of each counter cycle (in this case encompassing a number of M counts) the internal value of counter 342 may be reset for the next counter cycle. Thus, output of counter 342 may reflect a count number of M at the end of every trimming period, that is, occurring when the trimming loop is fully settled. While in the embodiment shown RD 340 is used to provide the reset signal to counter 342 and the output of PLD 210 is used as the clock signal for counter 342, alternate embodiments may have the output of PLD 210 connected as the reset signal for counter 342 and the output of RD 340 as the clock signal for counter 342, where subtraction element 361 is representative of the number of total trimming pulses to be subtracted from the output of counter 342.

In one embodiment, the difference appearing at the output of differentiator block 362 is passed to Gain 346 (in the embodiment shown, a multiplication block performing $2^n$). The exponential portion (n) of Gain 346 may be controlled by GC 344. Actual resolution achieved by GC 344 through Gain 346 may depend on the number of trim control lines 364 used by TC 350 to control the corresponding number of varactors in varactor bank 316. In one embodiment, the output of Gain 346 is provided to IR 348, and the output of IR 348 is used by TC 350 to control overall capacitance represented by varactor bank 316.

While the embodiment presented shows VCO 208 comprising LC tuning element 310 coupled with varactor bank 316, other embodiments may employ a ring oscillator instead of LC tuning element 310, in which case varactor bank 316 may be omitted, and trimming control by TC 350 through trim control lines 364 may be applied to one or more current sources operated to control current flow through the operational elements of the ring oscillator. In embodiments using a ring oscillator, the polarity of differentiator block 362 may be inverted, with the output of counter 342 coupled to the "−" terminal of differentiator block 362. The polarity inversion is performed because a decrease in frequency using a varactor bank may be achieved by increasing the capacitance, whereas using a ring oscillator the same effect may be achieved by reducing the current.

Figure 4:
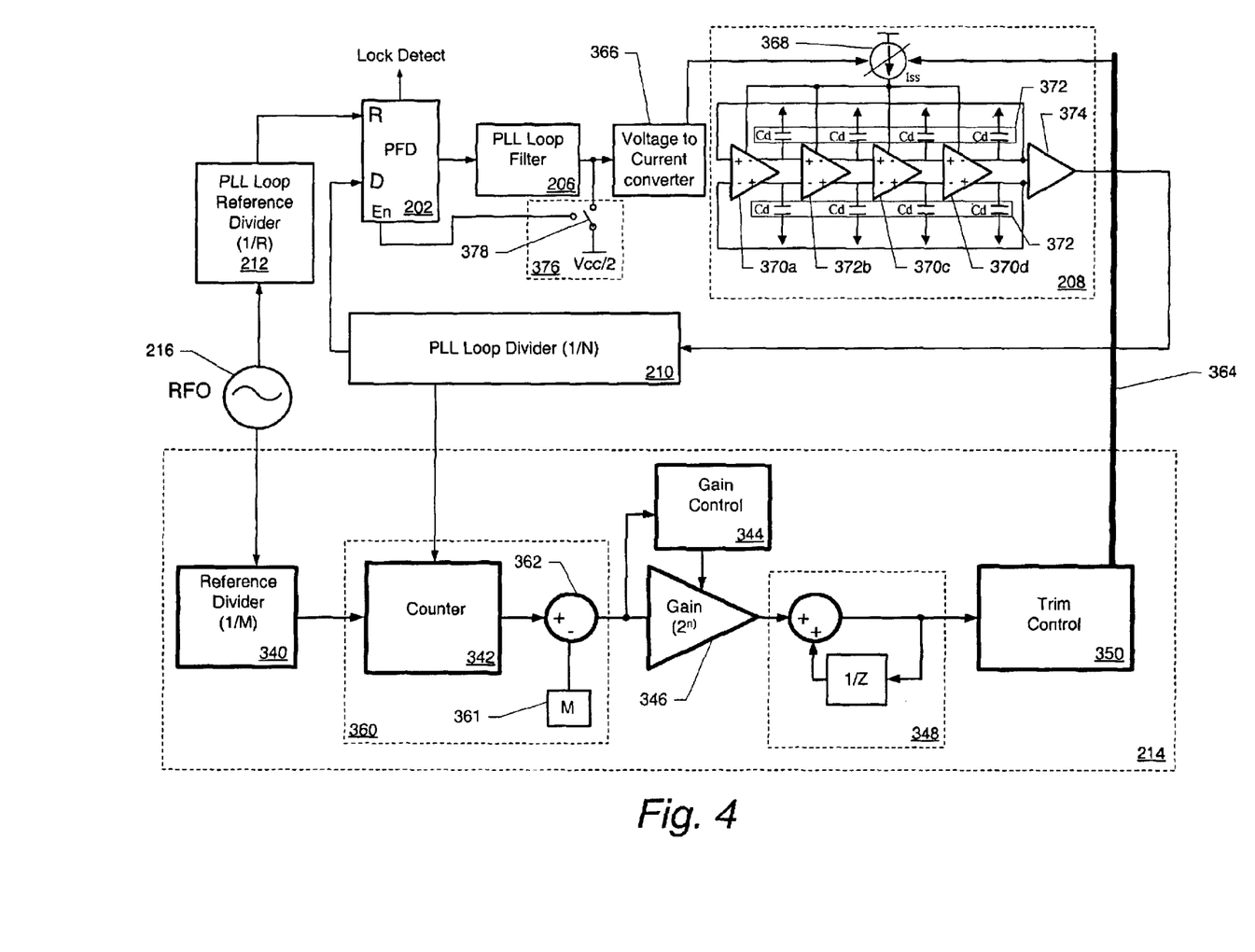
FIG. 4 illustrates one embodiment of the PLL shown in FIG. 2, using a ring oscillator.

FIG. 4 illustrates one embodiment of the invention that uses a ring oscillator for VCO 208. In this embodiment, PFD 202 is coupled to PLL loop filter 206, which feeds into a voltage-to-current converter device (VCCD) 366. The differential output of VCCD 366 is provided as input into a ring oscillator comprising operational transconductance amplifiers (OTAs) 370a, 370b, 370c, and 370d, as shown. The output of OTA 370d may be coupled as input to a differential-to-single-ended voltage converter (DSEC) 374, where the output of DSEC 374 may be provided as the output of VCO 208. A programmable current source 368 may be used to provide current Iss flowing through OTAs 370a–d, and may be programmed by DCTC 214 through trim control lines 364. The values derived from control bits affected by trim control lines 364 may correspond to respective levels of Iss to be provided by programmable current source 368. In case of an increase in Iss, the gain of the gain stages represented by OTAs 370a–d in the ring oscillator may increase, causing further charging of drain capacitances 370, leading to an increase in the output frequency of VCO 208. In the embodiment shown, the output frequency of VCO 208 is proportional to Iss. In one embodiment, programmable current source 368 may be a voltage controlled current source. Accordingly, trim control lines 364 may be operated to drive respective switches that may allow programmable current source 368 to increase current flowing through OTAs 370a–d in proportion to the frequency step required by VCO 208. While trim control lines 364 are operated to provide digital stepping of the value of Iss, in embodiments where lock time may not be an issue, the change in Iss affected by trim control lines 364 may be linear. While the embodiment of FIG. 4 includes a specific ring oscillator configured with OTAs as shown, those skilled in the art will recognize that alternate embodiments may utilize other circuit components and configurations, some of which may be alternate configurations of a ring oscillator, for implementing VCO 208.

In one embodiment, a switching circuit 376 is added to enable/disable the main PLL loop and trimming loop, respectively. To enable the main PLL loop, switch 378 may be operated to couple PDF 202 to Vcc/2, where Vcc represents a supply voltage, thus disconnecting the input to VCCD 366 from Vcc/2. Similarly, the trimming loop may be enabled by operating switch 378 to couple the input to VCCD 366 to Vcc/2 while decoupling PFD 202 from Vcc/2, thus simultaneously disabling the main PLL loop. It should be noted that independent and non-overlapping operating of the main PLL loop and the trimming loop may be implemented either as illustrated by switching circuit 376 in FIG. 4 or by alternate means well known to those skilled in the art.

Referring again to FIG. 3, in alternate embodiments GC 344 may be operated to yield non binary steps in order to obtain a faster lock time. Non binary steps may better fit the tuning curve, and may be used instead of the discussed binary steps when such a fit is required. For example, the non linear capacitance curve for a varactor may be expressed as:

$$C_{VARACTOR} = \frac{C_{VARACTOR\_at\_zero\_Volts}}{\sqrt[3]{1 - \frac{V_d}{X_o}}}; \quad (2)$$

where $X_o$ is a built-in potential of the varactor junction, in which case a cube fit may possibly yield a faster lock time.

In one embodiment, enabling and disabling the main PLL loop and the trimming loop, respectively, may be achieved through enable switching 320 similar to switching circuit 376 from FIG. 4. The output of PFD 202 may be disconnected from PLL loop filter 206 by opening switch 330, in effect disabling the main PLL loop while the trimming is performed. For the trimming period, switch 332 is closed, making the trimming loop operational. Once trimming has been performed, that is, when all the varactors in varactor bank 316 have been set through trim control lines 364, switch 332 may be opened, thus disabling the trimming loop, while switch 330 may be closed to allow the main PLL loop to complete locking on to the desired frequency. Those skilled in the art will recognize that alternative methods may be used for enabling/disabling the main PLL loop and the trimming loop, and that any such alternative methods may be used in lieu of enable switching 320.

In embodiments employing varactor bank 316, the bandwidth of the main PLL loop may be affected by the overall added capacitance introduced by the varactors in varactor bank 316. In order to maintain a substantially constant main PLL loop bandwidth, programmable current sources 322 may be used to effectively increase the gain of PFD 202 by boosting current flowing into PLL loop filter 206. Current sources 322 may be controlled via trim control lines 364, each change in current corresponding to a respective change affected in the total capacitance of varactor bank 316. In embodiments that use ring oscillators, current sources 322 may not be necessary to control the main PLL loop bandwidth.

Referring now to the functionality of DCTC 214, operation of RD 340 may be considered as one establishing an observation window through which RD 340 may further establish a new reference frequency for FD 360. For example, given a 13 MHz reference frequency, setting M to a value of 64, and having an average locking time of ten cycles, the trimming—the time while the trimming loop is operating and the main PLL loop is disabled—would take approximately 64*10/13 MHz, i.e. 50 $\mu$s. A tradeoff may have to be made between the percentage of frequency error and the number of fixed capacitor bits. The phase noise may increase as more circuit elements are attached and/or included in VCO 208. Similarly, the lock time of the PLL may increase when the difference between the trimmed frequency and the final frequency increases. Therefore, considerations may be made regarding lock time vs. phase noise vs. circuit complexity. The output of RD 340 may be edge triggered to provide a pulse at positive and negative edges, thus increasing the speed of the trimming loop.

FD 360 may operate as the frequency detector for the trimming loop. In one embodiment, FD 360 is implemented using a counter whose polarity is determined by the direction in which it counts. For VCO 208 with a positive polarity, where $v_c(t)$ 222 (see FIG. 2) is proportional to the output frequency $f_{out}$ of VCO 208, a down counter may be chosen. In one embodiment, the primary function of the counter is to yield a count equal to M. $F_r$ being the frequency of the signal provided by RD 340 to counter 342, the value of $F_r$ corresponds to a reference frequency (provided by RFO 216) divided by M. $F_d$ being the frequency of the signal provided by PLD 210 to counter 342, the value of $F_d$ corresponds to the current frequency $f_{out}$ (of $v_c(t)$ 222) divided by N. The output of counter 342 subtracted from the value M may yield zero when $F_d=F_r*M$. In other words, when $F_d$ is M times smaller than $F_r$, then $F_d$ is equal to the reference frequency, which results in the output of differentiator block 362 being zero.

GC 344 may operate to provide stability to the PLL loop under very wide gain variation, as well as speeding up convergence. The output of FD 360 may be sampled and multiplied. In other words, GC 344 may be used to speed up the trimming process. In one embodiment, GC 344 implements an adaptive multiplication of the error of counter 360, where GC 344 is controlled by the output of FD 360 and an initial power-of-two multiplying value (based on Gain 346 implemented as $2^n$). An error value that may trigger a lower gain may depend on the amount of gain variation expected by VCO 208, and may therefore be dependent on process and/or external conditions. Lowering the gain may overdamp the PLL loop, providing greater margin. In embodiments where the number of trim control lines 364 is small, the block may only have two gains; for example a gain of one and a gain of two. In one embodiment, multiplication for Gain 346 is performed using a barrel shifter.

Figure 5:
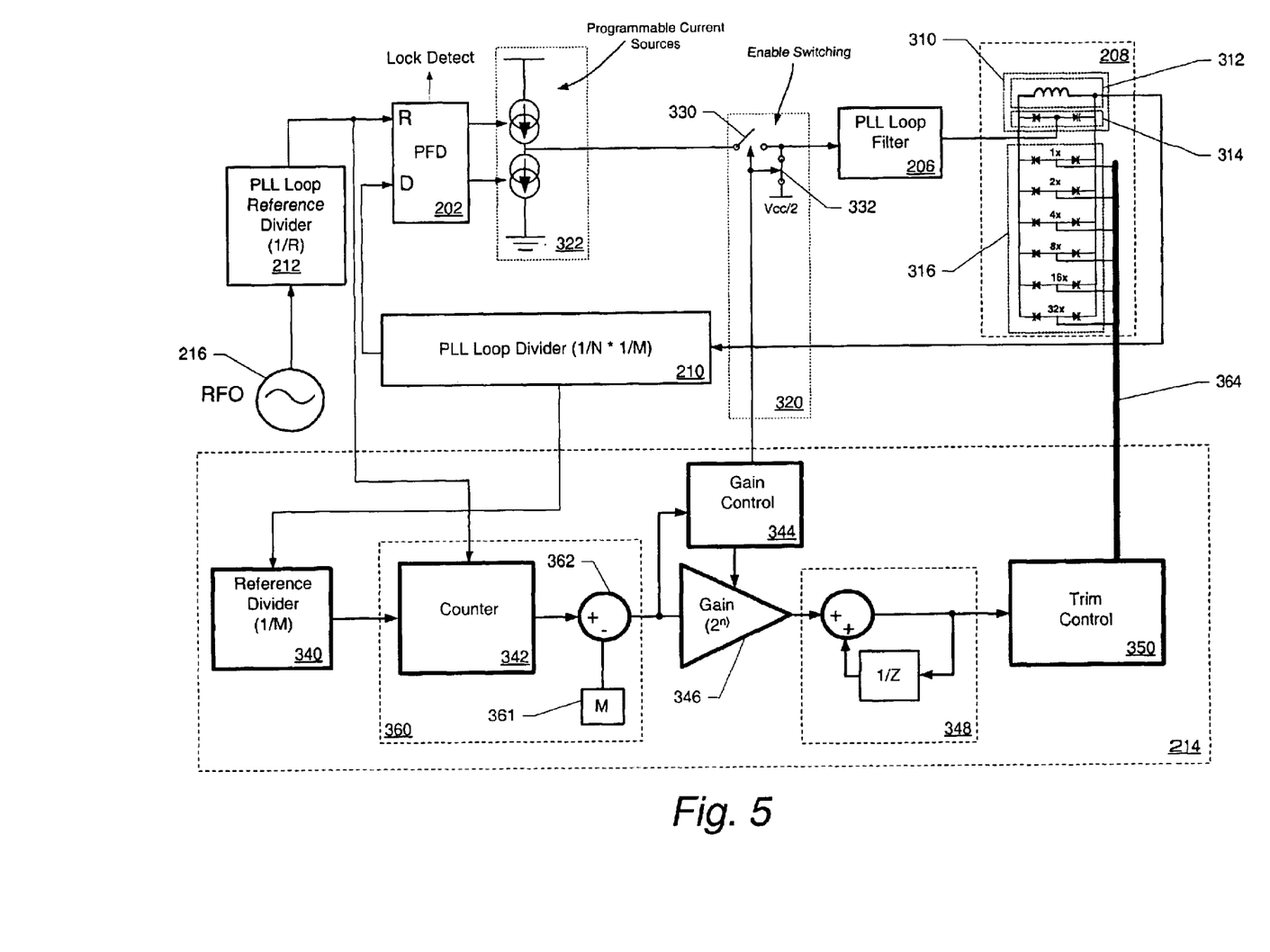
FIG. 5 illustrates a second embodiment of the PLL shown in FIG. 2, using varactors.
Figure 6:
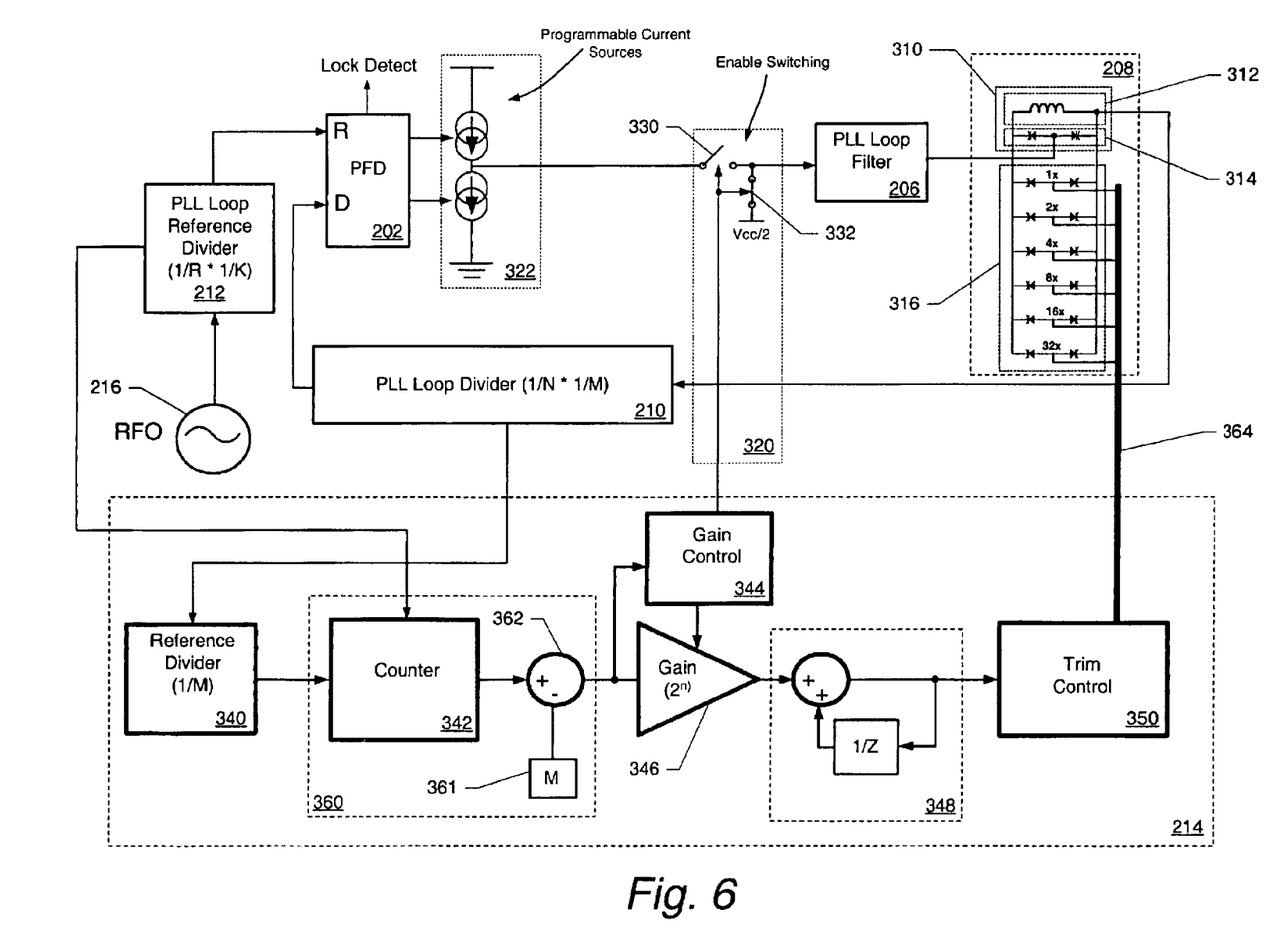
FIG. 6 illustrates a third embodiment of the PLL shown in FIG. 2, using varactors.

FIG. 5 shows an alternate embodiment of the invention. In this embodiment, PLD 210 is composed of two sections, a divide by N section and a divide by M section, and the oversampling clock signal input for RD 340 is obtained from the M tap of PLD 210. In this implementation, having a counter 342 clock rate that is a multiple M of the reference frequency (provided by RFO 216) may yield a value greater than M at the output of counter 342. Consequently, a negative value may be produced at the output of differentiator block 362, which may operate to reduce the trim control value, which may in turn add capacitance—in case of an embodiment that uses varactor bank 316—or reduce current—in case of an embodiment that uses a ring oscillator—to lower the frequency of VCO 208. In another embodiment, shown in FIG. 6, LRD 212 may also be composed of two sections, a divide by R section (tap used for main PLL loop) and a divide by K section (tap used for counter 342), in addition to PLD 210 comprising two sections as illustrated in the embodiment of FIG. 5. This embodiment may provide higher accuracy by increasing the frequency reference window for the trimming loop through appropriate selection of the value of K.

Figure 7:
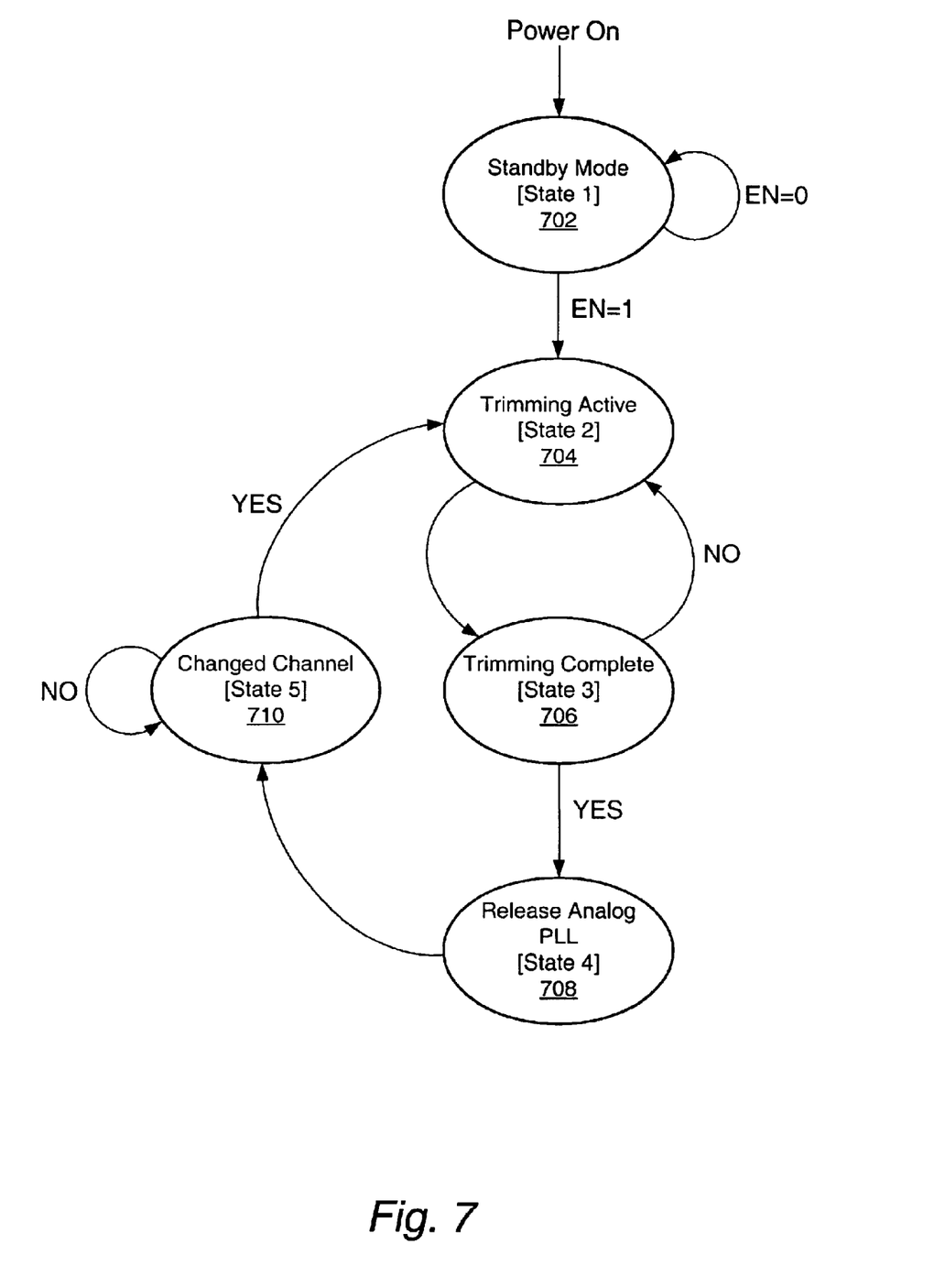
FIG. 7 illustrates a state diagram describing one way of controlling operation of the PLL illustrated in FIG. 2.

FIG. 7 illustrates a state diagram describing one possible way of controlling operation of the PLL illustrated in FIG. 2 through DCTC 214. In state 1 (702), DCTC 214 is in standby mode, drawing only leakage current from a power supply. In state 2 (704) the trimming process may be activated when changes to the frequency registers have been observed, or upon system power up/enable. Trimming may continue until a particular gain for VCO 208 is reached, at which time the trimming is complete, in state 3 (706). Following completion of trimming, the analog PLL loop may be released by DCTC 214 in state 4 (708). In state 5 (710) a new trimming cycle may be initiated, with a new desired frequency if required.

Thus, various embodiments of the systems and methods described above may facilitate the design of PLLs with reduced phase noise and increased frequency range of the main PLL loop, by using a digitally controlled trimming circuit in reducing the gain of the PLL VCO, while also providing a faster locking time.

Although the embodiments above have been described in considerable detail, other versions are possible. Numerous variations and modifications will become apparent to those skilled in the art once the above disclosure is fully appreciated. It is intended that the following claims be interpreted to embrace all such variations and modifications. Note the section headings used herein are for organizational purposes only and are not meant to limit the description provided herein or the claims attached hereto.

We claim:

1. A phase-locked loop (PLL) comprising:
   a phase detector;
   a loop filter coupled to the phase detector;
   a voltage controlled oscillator (VCO) coupled to the loop filter and to the phase detector;
   a control circuit coupled to the VCO; and
   a reference frequency coupled to the phase detector and to the control circuit;
   wherein the phase detector, the loop filter and the VCO comprise a main loop;
   wherein the VCO and the control circuit comprise a frequency trimming loop operable to bring an output frequency of the VCO to within a determined range of a desired locking frequency of the PLL; and
   wherein operation of the frequency trimming loop does not interfere with operation of the main loop, and operation of the main loop does not interfere with operation of the frequency trimming loop.

2. The PLL of claim 1, wherein the determined range of a desired locking frequency of the PLL represents a center frequency of the VCO.

3. The PLL of claim 1, wherein the control circuit is operable to modify a gain of the VCO.

4. The PLL of claim 1, wherein during operation of the frequency trimming loop, the main loop is disabled, and during operation of the main loop, the frequency trimming loop is disabled.

5. The PLL of claim 1 further comprising a loop divider coupling the VCO to the phase detector and to the control circuit.

6. The PLL of claim 1 further comprising a loop reference divider coupling the reference frequency to the phase detector.

7. The PLL of claim 1, wherein the control circuit comprises:
   a reference divider operable to divide the reference frequency;
   a frequency detector coupled to the reference divider;
   and integrator coupled to the phase detector; and
   a trim control circuit coupled to the integrator;
   wherein the trim control circuit is operable to control a tuning element of the VCO; and
   wherein the tuning element of the VCO is operable to control an output frequency of the VCO.

8. The PLL of claim 7, further comprising a loop divider coupling the VCO to the phase detector and to the control circuit;
   wherein the frequency detector comprises:
      a counter operable to output a count value; and
      a differentiator circuit operable to subtract a pulse number from the count value;
   wherein the reference divider is configured to provide a reset input to the counter;
   wherein the loop divider is configured to provide a clock signal to the counter; and
   wherein the operation of the trimming loop is disabled when the count value is equal to the pulse number.

9. The PLL circuit of claim 7, wherein the control circuit further comprises a gain element and controller coupling the frequency detector to the integrator;
   wherein the gain element and controller is configured to speed up convergence of the trimming loop.

10. The PLL circuit of claim 9, wherein in being configured to speed up convergence of the trimming loop, the gain element and controller is operable to sample and multiply an output of the frequency detector.

11. The PLL circuit of claim 1, wherein the VCO comprises an LC tuning element.

12. The PLL circuit of claim 11 further comprising one or more programmable current sources coupled to the phase detector;
   wherein the control circuit is operable to control the one or more programmable current sources; and
   wherein the one or more current sources are operable to increase a gain of the phase detector in proportion to an increase in capacitance of the LC tuning element.

13. The PLL circuit of claim 1, wherein the VCO comprises a ring oscillator.

14. A digitally controlled trimming circuit for trimming a center frequency of a VCO in a PLL, wherein the VCO includes a tuning element configured to control an output frequency of the VCO, the trimming circuit comprising:
   a frequency detector;
   an integrator coupled to the frequency detector; and
   a trim control circuit coupled to the integrator;
   wherein the frequency detector and the trim control circuit are operable to couple to the VCO to form a trimming loop;
   wherein the trim control circuit is operable to control the tuning element; and
   wherein the trimming loop is operable to not interfere with operation of the PLL.

15. The trimming circuit of claim 14, wherein the trimming circuit is operable to change a gain of the VCO.

16. The trimming circuit of claim 14;
   wherein the VCO comprises an LC tuning element; and
   wherein the tuning element comprises one or more varactors coupled to the LC tuning element; and
   wherein in controlling the tuning element the trim control circuit is operable to vary an overall capacitive value of the one or more varactors.

17. The trimming circuit of claim 16;
   wherein the trim control circuit comprises a number of trim control lines;
   wherein each of the one or more varactors is controlled by a respective one of the number of trim control lines.

18. The trimming circuit of claim 14;
   wherein the VCO comprises a ring oscillator;
   wherein the tuning element comprises one or more programmable current sources providing current to the ring oscillator;
   wherein in controlling the tuning element the trim control circuit is operable to vary an overall value of current provided by the one or more programmable current sources to the ring oscillator.

19. The trimming circuit of claim 18;
   wherein the trim control circuit comprises a number of trim control lines;
   wherein the number of trim control lines determines a minimum current value by which the trim control circuit is operable to vary the overall value of the current provided by the one or more programmable current sources to the ring oscillator.

20. The trimming circuit of claim 14, wherein the frequency detector comprises:
   a counter operable to output a count value; and
   a differentiator circuit operable to subtract a number from the count value;
   wherein the operation of the trimming loop is disabled when the count value is equal to the number.

21. The trimming circuit of claim 14 further comprising a gain element and controller coupling the frequency detector to the integrator;
   wherein the gain element and controller is configured to speed up convergence of the trimming loop.

22. The trimming circuit of claim 21, wherein in being configured to speed up convergence of the trimming loop, the gain element and controller is operable to sample and multiply an output of the frequency detector.

23. A method for trimming a center frequency of a VCO in a PLL, wherein the VCO includes a tuning element configured to control an output frequency of the VCO, the method comprising:
   selecting a value of the center frequency of the VCO from a range of available center frequency values based on characteristics of the VCO;
   receiving a VCO output signal from the VCO, wherein the VCO output signal comprises pulses according to a current frequency of the VCO output signal;
   counting a specified number of the pulses; and
   in response to each one of the specified number of the pulses, adjusting a value of the tuning element by a set amount, wherein said adjusting the value of the tuning element results in a decrease in a difference between the current frequency of the VCO output signal and the value of the center frequency of the VCO;

wherein the specified number of the pulses determines a value of the set amount; and wherein said trimming is completed upon having performed said adjusting in response to a last one of the specified number of the pulses.

24. The method of claim 23, wherein said adjusting the value of the tuning element comprises adjusting an overall capacitance of the tuning element.

25. The method of claim 23, wherein the VCO comprises a ring oscillator and the tuning element comprises one or more programmable current sources providing current to the ring oscillator;

wherein said adjusting the value of the tuning element comprises varying an overall value of the current provided by the one or more programmable current sources to the ring oscillator.

26. The method of claim 23 further comprising dynamically adjusting the set amount according to a value of the difference between the current frequency of the VCO output signal and the value of the center frequency of the VCO;

wherein said dynamically adjusting the set amount results in a substantial reduction of time required to perform said trimming.

27. A circuit comprising:

a detector circuit;

an oscillator circuit coupled to the detector circuit; and a control circuit coupled to the oscillator circuit;

wherein the detector circuit and the oscillator circuit comprise a primary loop, wherein the primary loop is operable to provide a signal having a specified frequency;

wherein the oscillator circuit and the control circuit comprise a trimming loop operable to bring an output frequency of the oscillator circuit to within a determined range of the specified frequency; and wherein operation of the trimming loop does not interfere with operation of the primary loop, and operation of the primary loop does not interfere with operation of the trimming loop.

28. The circuit of claim 27 further comprising a filter coupled to the detector circuit.

29. The circuit of claim 28, wherein the filter is a loop filter.

30. The circuit of claim 27 further comprising a reference frequency coupled to the detector circuit and to the control circuit, wherein the specified frequency is derived in part from the reference frequency.

31. The circuit of claim 27, wherein the control circuit is a digital circuit.

32. The circuit of claim 27;

wherein the circuit is a PLL;

wherein the detector circuit is a phase detector;

wherein the oscillator is a VCO;

wherein the output frequency of the oscillator circuit within a determined range of the specified frequency is a center frequency of the VCO; and wherein the specified frequency is a desired locking frequency of the PLL.

33. A method for trimming a default frequency of an oscillator circuit configured in a circuit operable to generate a signal with a specified frequency, wherein the oscillator circuit includes a tuning element configured to control an output frequency of the oscillator circuit, the method comprising:

selecting a value of the center frequency of the oscillator circuit from a range of available center frequency values based on characteristics of the oscillator circuit;

receiving an oscillator circuit output signal from the oscillator circuit, wherein the oscillator circuit output signal comprises pulses according to a current frequency of the oscillator circuit output signal;

counting a specified number of the pulses; and in response to each one of the specified number of the pulses, adjusting a value of the tuning element by a set amount, wherein said adjusting the value of the tuning element results in a decrease in a difference between the current frequency of the oscillator circuit output signal and the value of the center frequency of the oscillator circuit;

wherein the specified number of the pulses determines a value of the set amount;

wherein the specified frequency is derived in part from the output frequency of the oscillator circuit; and wherein said trimming is completed upon having performed said adjusting in response to a last one of the specified number of the pulses.

* * * * *